United States Patent
Chuang et al.

(10) Patent No.: US 7,834,469 B2
(45) Date of Patent: Nov. 16, 2010

(54) STACKED TYPE CHIP PACKAGE STRUCTURE INCLUDING A CHIP PACKAGE AND A CHIP THAT ARE STACKED ON A LEAD FRAME

(75) Inventors: Yao-Kai Chuang, Kaohsiung (TW); Chien Liu, Kaohsiung (TW); Chih-Ming Chung, Kaohsiung County (TW); Chao-Cheng Liu, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/428,277

(22) Filed: Apr. 22, 2009

(65) Prior Publication Data
US 2009/0278242 A1 Nov. 12, 2009

(30) Foreign Application Priority Data
May 12, 2008 (TW) ............... 97117464 A

(51) Int. Cl.
*H01L 23/29* (2006.01)
(52) U.S. Cl. ............ 257/790; 257/686; 257/777; 257/676; 257/E25.006
(58) Field of Classification Search .......... 257/666, 257/685, 686, 723, 777, 778, 784, 786, 787, 257/790, E25.006, E25.013, E25.018, E25.021, 257/E25.027, E23.085, E21.614, 676, E23.031
See application file for complete search history.

(56) References Cited

U.S. PATENT DOCUMENTS

| 6,995,459 | B2 * | 2/2006 | Lee et al. ............... 257/676 |
| 7,166,495 | B2 * | 1/2007 | Ball .................. 438/109 |
| 2005/0023667 | A1 | 2/2005 | Lin et al. ............... 257/686 |
| 2007/0164403 | A1 * | 7/2007 | Huang et al. ............ 257/666 |
| 2007/0164411 | A1 * | 7/2007 | Huang et al. ............ 257/678 |
| 2007/0194417 | A1 * | 8/2007 | Yoshida ............... 257/678 |
| 2008/0179758 | A1 * | 7/2008 | Wong et al. ............ 257/778 |

FOREIGN PATENT DOCUMENTS

JP 2005317998 11/2005

OTHER PUBLICATIONS

Chinese First Examination Report of China Application No. 20081009856710, dated Jun. 5, 2005.

* cited by examiner

*Primary Examiner*—Davienne Monbleau
*Assistant Examiner*—Dilinh P Nguyen
(74) *Attorney, Agent, or Firm*—Cooley LLP

(57) ABSTRACT

A stacked type chip package structure including a lead frame, a chip package, a second chip, and a second molding compound is provided. The lead frame includes a plurality of first leads and second leads insulated from one another. The first leads have a first upper surface, and the second leads have a second upper surface which is not co-planar with the first upper surface. The chip package is disposed on the first leads and includes a substrate, a first chip, and a first molding compound. The second chip is stacked on the chip package and electrically connected to the second leads. The second molding compound is disposed on the lead frame and filled among the first leads and the second leads for encapsulating the chip package and the second chip.

18 Claims, 4 Drawing Sheets ent invention relates to a chip package structure, and more particular, to a stacked type chip package structure.

STACKED TYPE CHIP PACKAGE STRUCTURE INCLUDING A CHIP PACKAGE AND A CHIP THAT ARE STACKED ON A LEAD FRAME

CROSS-REFERENCE TO RELATED APPLICATION

This application claims the priority benefit of Taiwan application serial no. 97117464, filed on May 12, 2008. The entirety of the above-mentioned patent application is hereby incorporated by reference herein and made a part of specification.

BACKGROUND OF THE INVENTION

1. Field of the Invention

The present invention relates to a chip package structure, and more particular, to a stacked type chip package structure.

2. Description of Related Art

In the semiconductor manufacturing industry, the production of integrated circuit (IC) devices is mainly divided into three stages including IC design, IC process and IC package.

During the IC process, a chip is manufactured by steps of wafer fabrication, IC formation, wafer sawing and so on. A wafer has an active surface, which generally refers to the surface including active devices. After the IC inside the wafer is completely formed, a plurality of bonding pads are further disposed on the active surface of the wafer such that the chip formed by sawing the wafer may be externally electrically connected to a carrier through the bonding pads. The carrier may be a lead frame or a package substrate, for example. The chip can be connected to the carrier by wire bonding or by flip chip bonding such that the bonding pads on the chip are electrically connected to contacts of the carrier, thereby forming a chip package structure.

FIGS. 1A~1E are schematic, cross-sectional diagrams illustrating the process flow for fabricating a semiconductor device disclosed in Japanese Patent Application Publication No. 2005-317998. First, referring to FIG. 1A, a copper foil 21 is provided, which has a first patterned metallic layer 22 and a second patterned metallic layer 23 respectively formed on an upper surface and a lower surface of the copper foil 21 as electrical contacts. Referring to FIG. 1B, an etching resistance layer 24 is formed on the lower surface of the copper foil 21. Then, a half-etching process is performed on the upper surface of the copper foil 21 by using the first patterned metallic layer 22 as an etching mask so as to form a plurality of recessions R on the upper surface of the copper foil 21. Referring to FIG. 1C, a semiconductor device 11 is fixed on one of the recessions R serving as a die pad by using an adhesion layer 20. In addition, a plurality of conductive lines 16 are formed between the semiconductor device 11 and a wire bonding section 12 of the copper foil 21. Referring to FIG. 1D, a second insulating material 18 is formed on the upper surface of the copper foil 21 to encapsulate the semiconductor device 11, the conductive line 16, and the upper surface of the copper foil 21. At last, referring to FIG. 1E, a back etching process is performed on the lower surface of the copper foil 21 by using the second patterned metallic layer 23 as an etching mask for so as to form a chip package structure 10 having an area array lead.

The package structure formed by the above-mentioned method forming the die pad and the leads by etching the cooper foil is a new type of QFN package. The advantage is that the number of leads can be increased, such that the package formed by this method may meet the requirements of miniaturization and high density. However, the new type of QFN package is mainly for packaging a single chip and does not meet the current need for multi-chip module packaging.

SUMMARY OF THE INVENTION

The present invention provides a stacked type chip package structure, which introduces the concept of package-in-package (PIP) into the new type of QFN package structure, so as to increase the package density of the entire chip package structure.

The present invention provides a stacked type chip package structure comprising a lead frame, a chip package, a second chip, and a second molding compound. The lead frame comprises a plurality of first leads and second leads insulated from one another. The first leads have a first upper surface, and the second leads have a second upper surface which is not coplanar with the first upper surface. The chip package is disposed on the first upper surface of the first leads and comprises a substrate, a first chip and a first molding compound. The substrate is electrically connected to the first leads. The first chip is disposed on the substrate and electrically connected to the substrate. The first molding compound is disposed on the substrate and encapsulates the first chip. The second chip is stacked on the chip package and electrically connected to the second leads. The second molding compound is disposed on the lead frame and filled among the second leads to encapsulate the chip package and the second chip.

In one embodiment of the present invention, a first chip is electrically connected to a substrate through a plurality of bonding wires.

In one embodiment of the present invention, a first chip is electrically connected to a substrate through a plurality of solder bumps.

In one embodiment of the present invention, a chip package further comprises a third chip. The third chip is stacked on a first chip and electrically connected a substrate.

In one embodiment of the present invention, a chip package further comprises a fourth chip and a fifth chip. The fourth chip is disposed on a substrate and electrically connected to the substrate. The fifth chip crosses over the first chip and the fourth chip and electrically connected to the first chip and the fourth chip.

In one embodiment of the present invention, a substrate is electrically connected to first leads through a plurality of solder bumps.

In one embodiment of the present invention, a chip package is turned upside down on first leads and a substrate is electrically connected to second leads through a plurality of bonding wires.

In one embodiment of the present invention, a second chip is electrically connected to a substrate through a plurality of bonding wires.

In one embodiment of the present invention, a second chip is electrically connected to second leads through a plurality of bonding wires.

In one embodiment of the present invention, first leads and second leads protrude from a second molding compound.

The present invention also provides a stacked type chip package structure comprising a lead frame, a chip package, a second chip, and a second molding compound. The lead frame comprises a plurality of first leads and second leads insulated from one another. The chip package is fixed on the first leads of the lead frame and comprises a substrate, a first chip, and a first molding compound. The substrate comprises a first surface and a corresponding second surface. The substrate comprises a plurality of solder bumps disposed on the second surface and exposed from the lead frame. The first chip is disposed on the substrate and electrically connected to the substrate. The first molding compound is disposed on the substrate and encapsulates the first chip. The second chip is stacked on the chip package and electrically connected to the second leads. The second molding compound is disposed on the lead frame and filled among the first leads and the second leads to encapsulate the first molding compound and the second chip.

In one embodiment of the present invention, a first chip is electrically connected to a substrate through a plurality of bonding wires.

In one embodiment of the present invention, a first chip is electrically connected to a substrate through a plurality of solder bumps.

In one embodiment of the present invention, a chip package further comprises a third chip. The third chip is stacked on a first chip and electrically connected a substrate.

In one embodiment of the present invention, a chip package further comprises a fourth chip and a fifth chip. The fourth chip is disposed on a substrate and electrically connected to the substrate. The fifth chip crosses over the first chip and the fourth chip and electrically connected to the first chip and the fourth chip.

In one embodiment of the present invention, a second chip is electrically connected to second leads through a plurality of bonding wires.

In one embodiment of the present invention, first leads and second leads protrude from a second molding compound.

In one embodiment of the present invention, each first lead has a step structure. The step structure forms an accommodating concave in which a chip package is fixed.

In one embodiment of the present invention, first leads have a first upper surface and second leads have a second upper surface. The first upper surface and the second upper surface are not co-planar.

The stacked type chip package structure of the present invention is to integrate the new type QFN package and the PIP technology to stack a chip package and another chip on a lead frame formed by etching a metal board. Accordingly, a stacked type chip structure of stacking a chip on a chip package may be formed. Besides, the needs for miniaturization and high density of the package structure may also be satisfied.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The stacked type chip package structure in the present invention may be applied to chip packages that have been packaged and the integration of different types of chips such as common digital chips, analog chips or memory chips. To cover the above variations, a first chip, a second chip, a third chip, a fourth and a fifth chip are used to represent different types of chips.

Figure 1A:
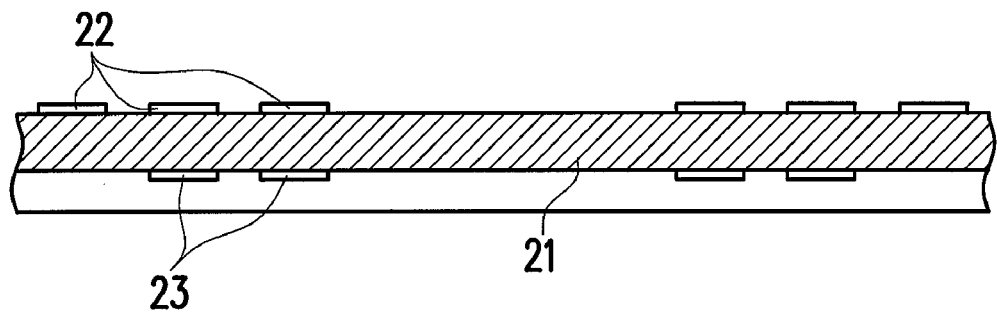
FIGS. 1A~1E are schematic, cross-sectional diagrams illustrating the process flow for fabricating a semiconductor device disclosed in Japanese Patent Application Publication No. 2005-317998.
Figure 1B:
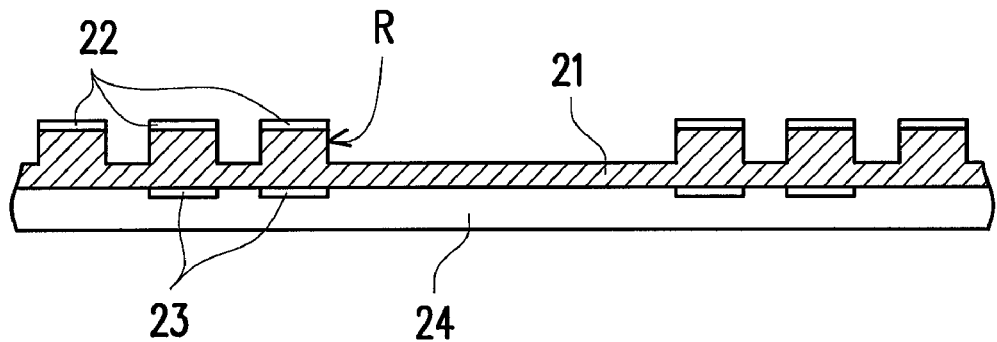
Figure 1C:
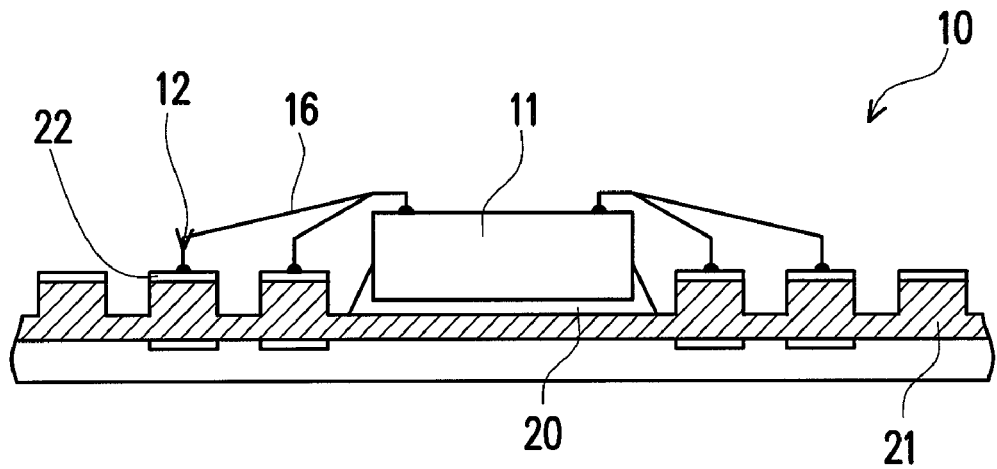
Figure 1D:
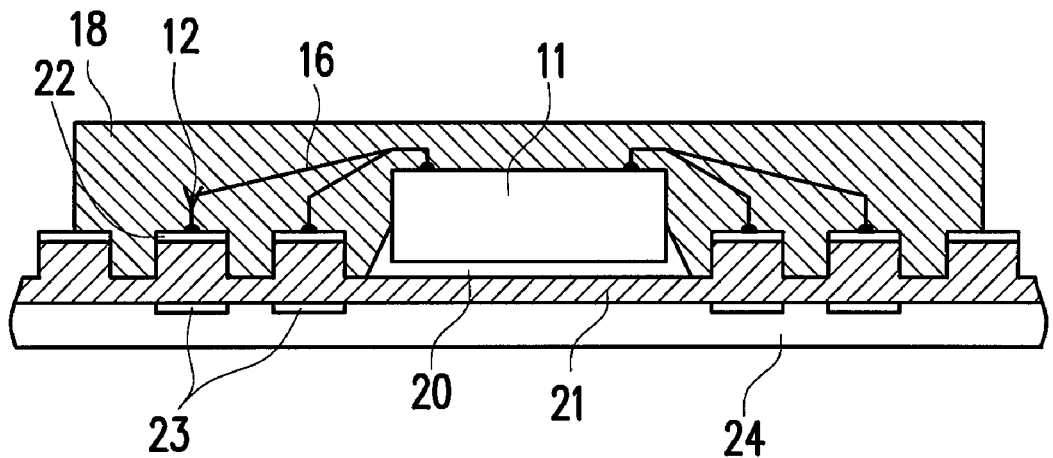
Figure 1E:
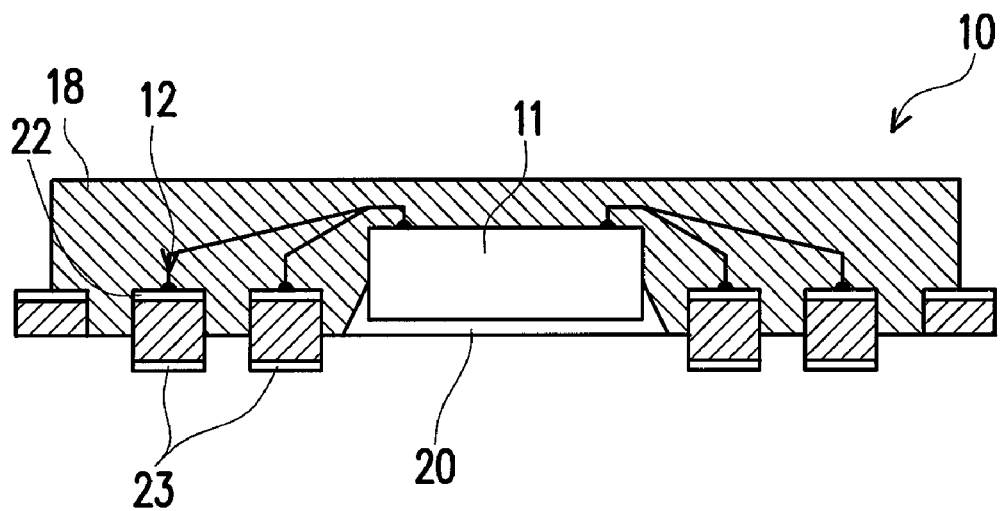
Figure 2A:
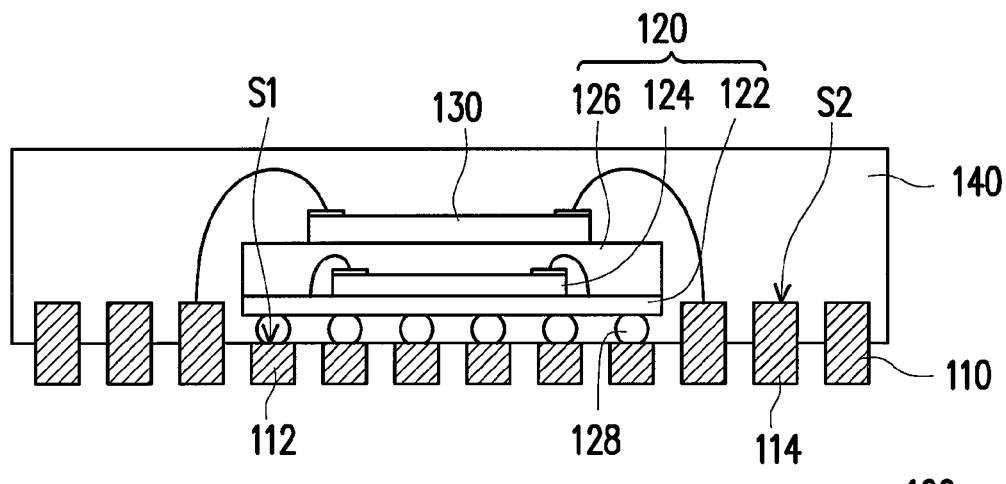
FIG. 2A is a schematic cross-sectional view of a stacked type chip package structure according to the first embodiment of the present invention.

FIG. 2A is a schematic cross-sectional view of a stacked type chip package structure according to the first embodiment of the present invention. Referring to FIG. 2A, a stacked type chip package structure 100 mainly comprises a lead frame 110, a chip package 120, a second chip 130, and a second molding compound 140. Components of the stacked type chip package structure 100 and connecting correlations between the components will be described hereinafter with reference to the drawings.

The lead frame 110 comprises a plurality of first leads 112 and second leads 114 insulated from one another. The first leads 112 and the second leads 114 are formed by steps of etching a metal board such as a copper foil and so on. As shown in FIG. 2A, the first leads 112 have a first upper surface S1 and the second leads 114 have a second upper surface S2, which is not co-planar with the first upper surface S1.

The chip package 120 may be a chip scale package. The chip package 120 is disposed on the first upper surface S1 of the first leads 112 and comprises a substrate 122, a first chip 124, and a first molding compound 126. The first chip 124 is disposed on the substrate 122 and electrically connected to the substrate 122. In one embodiment of the present invention, the first chip 124 may be fixed on the substrate 122 through an adhesive layer (not shown). As shown in FIG. 2A, in the present embodiment, the first chip 124 is electrically connected to the substrate 122 through a plurality of bonding wires. However, the first chip 124 may also be electrically connected to the substrate 122 through a plurality of solder bumps with a flip chip bonding method, which is not limited herein. The first molding compound 126 is disposed on the substrate 122 and encapsulates the first chip 124 and the bonding wires. The entire chip package 120 is electrically connected to the corresponding first leads 112 through a plurality of solder bumps 128 disposed on the lower surface of the substrate 122.

The second chip 130 is stacked on the chip package 120 and electrically connected to the second leads 114 of the lead frame 110. In the present embodiment, a second chip 130 is electrically connected to second leads 114 through a plurality of bonding wires. In addition, the second chip 130 may be fixed on the chip package 120 through an adhesive layer (not shown). The second molding compound 140 is disposed on the lead frame 110 and filled among the first leads 112 and the second leads 114 to encapsulate the chip package 120, the solder bumps 128, and the second chip 130. In addition, the first leads 112 and the second leads 114 protrude from the second molding compound 140.

Figure 2B:
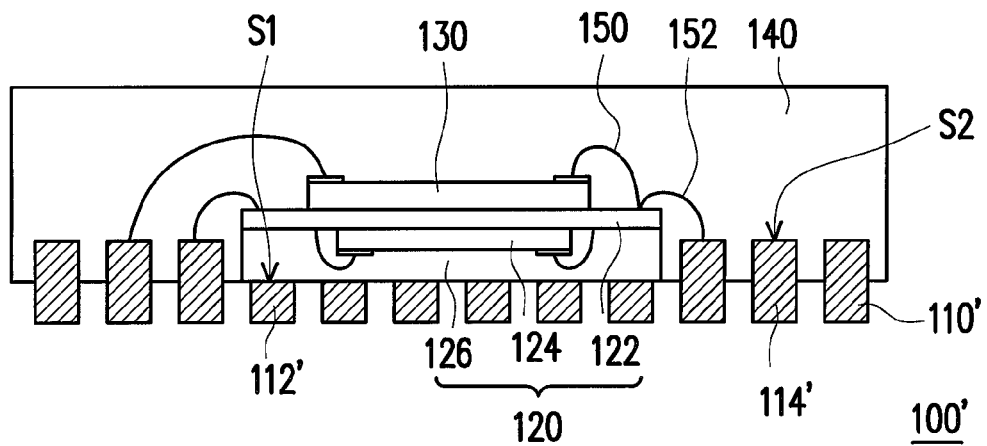
FIG. 2B is a schematic cross-sectional view of a stacked type chip package structure according to the second embodiment of the present invention.

FIG. 2B is a schematic cross-sectional view of a stacked type chip package structure according to the second embodiment of the present invention. Referring to FIG. 2B, a stacked type chip package structure 100' is similar to the stacked type chip package structure 100 in the first embodiment. The main difference is that in the stacked type chip package structure 100', a chip package 120 is turned upside down on first leads 112' of a lead frame 110'. Accordingly, a second chip 130 may be electrically connected to a substrate 122 through a wire bonding conductive line 150 and the substrate 122 may then be electrically connected to second leads 114' through a wire bonding conductive line 152.

Figure 3:
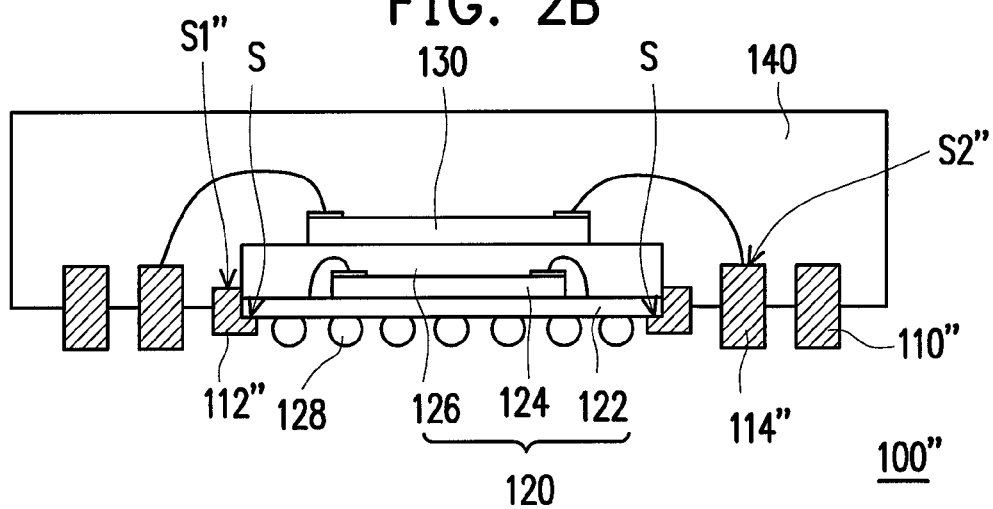
FIG. 3 is a schematic cross-sectional view of a stacked type chip package structure according to the third embodiment of the present invention.

FIG. 3 is a schematic cross-sectional view of a stacked type chip package structure according to the third embodiment of the present invention. Referring to FIG. 3, a stacked type chip package structure 100" is a little different from the stacked type chip package structure 100 in FIG. 2A. The main difference is that in the stacked type chip package structure 100 in FIG. 2A, the chip package 120 is entirely encapsulated in the second molding compound 140 and then electrically connected to the leads 112 through the solder bumps 128 on the substrate 122. In the stacked type chip package structure 100" in FIG. 3, a lead frame 110" similarly comprises first leads 112" and second leads 114". A chip package 120 is fixed on the first leads 112" of the lead frame 110". The lower surface of the chip package 120 and solder bumps 128 are exposed from the lower surface of the lead frame 110". As a result, the solder bumps 128 and the second leads 114" may be used as electrical contacts for other electronic devices.

Furthermore, as shown in FIG. 3, the first leads 112" have a first upper surface S1" and the second leads 114" have a second upper surface S2", which is not co-planar with the first upper surface S1". In addition, each of the first lead 112" has a step structure S. The step structures S form an accommodating concave in which the chip package 120 is fixed.

Furthermore, in the present embodiment, the bottoms of the solder bumps 128 are co-planar with the lower surface of the second leads 114". However, the bottoms of the solder bumps 128 may also be slightly higher than the lower surface of the second leads 114" as long as the exposed solder bumps 128 may be electrically connected to other electronic devices. In addition, in the third embodiment, the first chip 124 of the chip package 120 is electrically connected to the substrate 122 through wire bonding, which may also be connected through flip chip bonding, however. The present invention does not limit the method of how the first chip 124 and the substrate 122 are electrically connected.

In above embodiment, the chip package 120 is illustrated with stacking a single chip on a substrate as an example. However, the chip package 120 may also be a chip package structure formed with stacking a plurality of chips. Two examples are shown below. However, the present invention does not limit the number of chips in the chip package 120 and the method on how the chips are electrically connected.

Figure 4A:
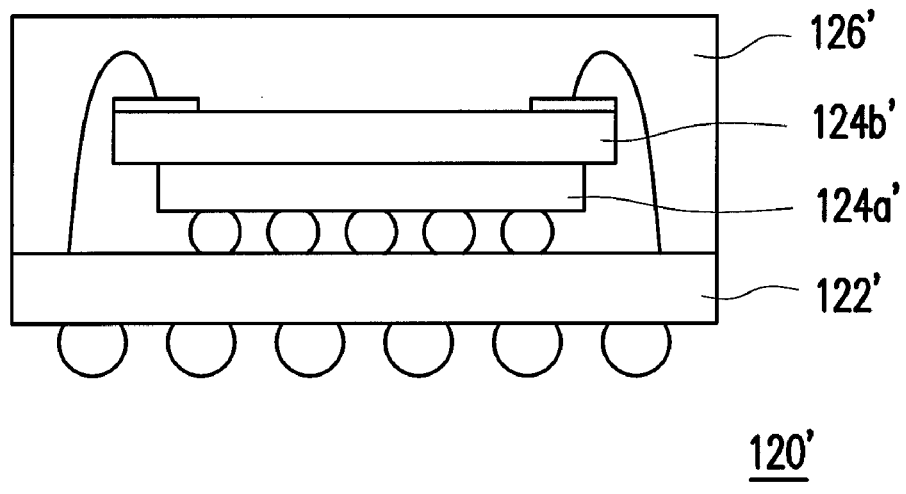
FIGS. 4A and 4B are schematic cross-sectional views of other types of chip package structures.
Figure 4B:
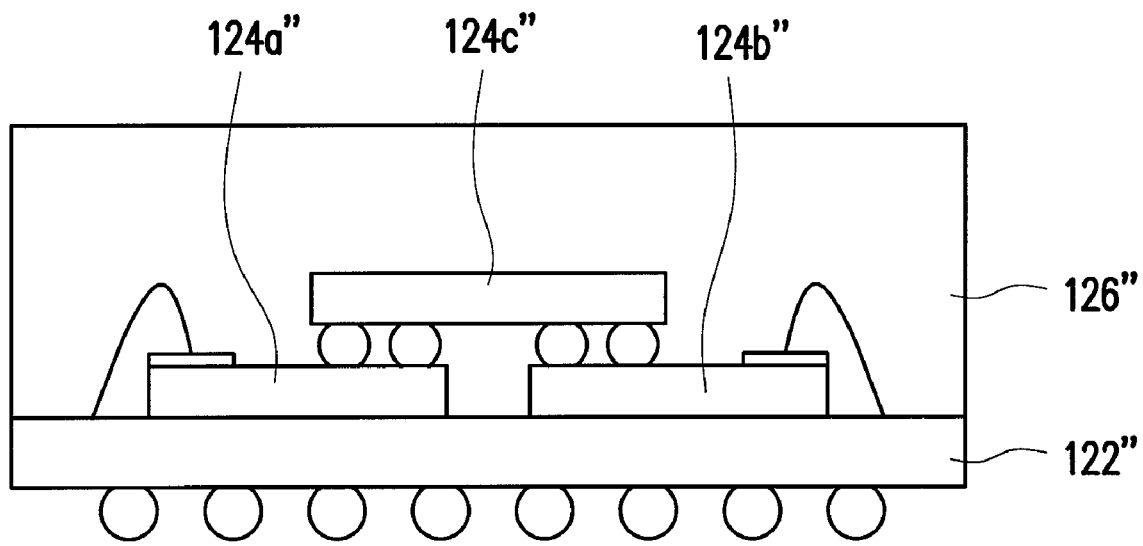

FIGS. 4A and 4B are schematic cross-sectional views of other types of chip package structures. First, referring to FIG. 4A, a chip package 120' comprises a substrate 122', a first chip 124a', a second chip 124b', and a first molding compound 126'. The first chip 124a' is disposed on the substrate 122' and electrically connected to the substrate 122' through flip chip bonding. The second chip 124b' is stacked on the first chip 124a' and electrically connected to the substrate 122' through wire bonding. The first molding compound 126' is disposed on the substrate 122' and encapsulates the first chip 124a', the second chip 124b', and the bonding wires. Referring to FIG. 4B, a chip package 120" comprises a substrate 122", a first chip 124a", a second chip 124b", a third chip 124c", and a first molding compound 126". The first chip 124a" and the second chip 124b" are disposed on the substrate 122" and electrically connected to the substrate 122" through wire bonding. The third chip 124c" crosses over the first chip 124a" and the second chip 124b" and electrically connected to the first chip 124a" and the second chip 124b" through flip chip bonding. The first molding compound 126" is disposed on the substrate 122" and encapsulates the first chip 124a", the second chip 124b", and the third chip 124c".

In summary, the stacked type chip package structure of the present invention mainly integrates the new type QFN package and the PIP technology to stack a chip package and another chip on a lead frame formed by etching a metal board such that the needs for miniaturization and high density of the package structure may be satisfied. Furthermore, the design of the leads being not co-planar with one another reduces the overall height of the stacked type chip package structure and the distance of wire bonding of the second chip.

It will be apparent to those of ordinary skills in the technical field that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A stacked type chip package structure, comprising:
   a lead frame, comprising a plurality of first leads and second leads insulated from one another, wherein the first leads have a first upper surface and the second leads have a second upper surface which is not co-planar with the first upper surface;
   a chip package, disposed on the first upper surface of the first leads, the chip package comprising:
      a substrate, electrically connected to the first leads;
      a first chip, disposed on the substrate and electrically connected to the substrate; and
      a first molding compound, disposed on the substrate and encapsulating the first chip;
   a second chip, stacked on the chip package and electrically connected to the second leads; and
   a second molding compound, disposed on the lead frame and filled among the first leads and the second leads to encapsulate the chip package and the second chip, wherein the second molding compound has a lower surface, and each of the first leads and the second leads includes an upper portion, the upper portion of each of the first leads attached to the lower surface of the second molding compound, the upper portion of each of the second leads encapsulated by the second molding compound, and a lower portion, protruding from the lower surface of the second molding compound.

2. The stacked type chip package structure according to claim 1, wherein the first chip is electrically connected to the substrate through a plurality of bonding wires.

3. The stacked type chip package structure according to claim 1, wherein the first chip is electrically connected to the substrate through a plurality of solder bumps.

4. The stacked type chip package structure according to claim 1, wherein the chip package further comprises a third chip stacked on the first chip and electrically connected to the substrate.

5. The stacked type chip package structure according to claim 1, wherein the chip package further comprises a third chip and a fourth chip, the third chip is disposed on the substrate and electrically connected to the substrate, and the fourth chip crosses over the first chip and the third chip and electrically connected to the first chip and the third chip.

6. The stacked type chip package structure according to claim 1, wherein the substrate is electrically connected to the first leads through a plurality of solder bumps.

7. The stacked type chip package structure according to claim 1, wherein the second chip is electrically connected to the second leads through a plurality of bonding wires.

8. The stacked type chip package structure according to claim 1, wherein an upper portion of each of the second leads has sides fully encapsulated by the second molding compound.

9. A stacked type chip package structure, comprising:

a lead frame, comprising a plurality of first leads and second leads insulated from one another;

a chip package, fixed on the first leads of the lead frame, the chip package comprising:

a substrate, having a first surface and a second surface opposite to the first surface, wherein the substrate comprises a plurality of solder bumps disposed on the second surface and exposed from the lead frame;

a first chip, disposed on the substrate and electrically connected to the substrate; and a first molding compound, disposed on the substrate and encapsulating the first chip;

a second chip, stacked on the chip package and electrically connected to the second leads; and a second molding compound, disposed on the lead frame and filled among the first leads and the second leads to encapsulate the first molding compound and the second chip, while the plurality of solder bumps of the chip package are exposed from the second molding compound.

10. The stacked type chip package structure according to claim 9, wherein the first chip is electrically connected to the substrate through a plurality of bonding wires.

11. The stacked type chip package structure according to claim 9, wherein the first chip is electrically connected to the substrate through a plurality of solder bumps.

12. The stacked type chip package structure according to claim 9, wherein the chip package further comprises a third chip stacked on the first chip and electrically connected to the substrate.

13. The stacked type chip package structure according to claim 9, wherein the chip package further comprises a third chip and a fourth chip, the third chip is disposed on the substrate and electrically connected to the substrate, and the fourth chip crosses over the first chip and the third chip and electrically connected to the first chip and the third chip.

14. The stacked type chip package structure according to claim 9, wherein the second chip is electrically connected to the second leads through a plurality of bonding wires.

15. The stacked type chip package structure according to claim 9, wherein the first leads and the second leads protrude from the second molding compound.

16. The stacked type chip package structure according to claim 9, wherein each of the first leads comprises a step structure forming an accommodating concave in which the chip package is fixed.

17. The stacked type chip package structure according to claim 9, wherein the first leads have a first upper surface and the second leads have a second upper surface which is not co-planar with the first upper surface.

18. The stacked type chip package structure according to claim 9, wherein the second molding compound has a lower surface, and the plurality of solder bumps of the chip package expose from the lower surface of the second molding compound.

* * * * *